(12) United States Patent
Schapendonk

(10) Patent No.: US 9,928,870 B1
(45) Date of Patent: Mar. 27, 2018

(54) SYSTEM AND METHOD FOR PROVIDING AN OUTPUT SIGNAL WITHOUT OR WITH REDUCED JITTER BASED UPON AN INPUT SIGNAL NOTWITHSTANDING PHASE CHANGES IN A CLOCK SIGNAL

(71) Applicant: NXP B.V., Eindhoven (NL)

(72) Inventor: Edwin Schapendonk, Oss (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/720,036

(22) Filed: Sep. 29, 2017

(51) Int. Cl.
| | |
|---|---|
| *H03M 1/66* | (2006.01) |
| *G11B 20/10* | (2006.01) |
| *H03M 1/88* | (2006.01) |
| *G01R 31/317* | (2006.01) |

(52) U.S. Cl.
CPC .. *G11B 20/10268* (2013.01); *G01R 31/31725* (2013.01); *G11B 20/10037* (2013.01); *G11B 20/10203* (2013.01); *G11B 20/10222* (2013.01); *H03M 1/661* (2013.01); *H03M 1/88* (2013.01)

(58) Field of Classification Search
CPC ........ G11B 20/10268; G11B 20/10203; G11B 20/10037; H03M 1/661; G01R 31/31725
USPC .................................................. 341/120, 144
See application file for complete search history.

(56) References Cited

U.S. PATENT DOCUMENTS

| | | | |
|---|---|---|---|
| 6,300,758 B1 | 10/2001 | Griffen | |
| 7,671,773 B2 * | 3/2010 | Ceballos | ............... H03M 3/372 341/118 |
| 8,350,734 B1 * | 1/2013 | Mallinson | ............... H03M 7/02 341/58 |

OTHER PUBLICATIONS

KMI25/2; KMI25/4 High Performance Rotational Speed Sensor. Product data sheet. NXP Semiconductors. Rev. 1, Apr. 29, 2016.
Schapendonk, Edwin; "Declaration"; (Jan. 5, 2018).

* cited by examiner

*Primary Examiner* — Brian Young
(74) *Attorney, Agent, or Firm* — Charlene R. Jacobsen

(57) ABSTRACT

Systems and methods for providing an output signal based at least in part upon an input signal and a clock signal in a manner in which jitter is avoided or diminished, including for example a digital-to-analog converter (DAC), are disclosed herein. In one example embodiment, such a system includes an output signal generating component, a first component having a first switch and a variable characteristic, and a plurality of second components each having a respective additional switch and a respective fixed characteristic. A value of the variable characteristic is set at least in part based upon input and clock signals so that, when the variable characteristic influences at least indirectly the generating of the output signal by the output signal generating component, the output signal attains a first level that at least indirectly depends upon a phase of the clock signal relative to the input signal.

20 Claims, 6 Drawing Sheets

US 9,928,870 B1

SYSTEM AND METHOD FOR PROVIDING AN OUTPUT SIGNAL WITHOUT OR WITH REDUCED JITTER BASED UPON AN INPUT SIGNAL NOTWITHSTANDING PHASE CHANGES IN A CLOCK SIGNAL

CROSS-REFERENCE TO RELATED APPLICATIONS

- -

STATEMENT REGARDING FEDERALLY SPONSORED RESEARCH OR DEVELOPMENT

- -

FIELD OF THE DISCLOSURE

The present disclosure relates to systems and methods for signal processing and more particularly, for example, to systems and methods for processing signals to reduce or eliminate jitter.

BACKGROUND OF THE DISCLOSURE

Many systems require digital processing even when the input and/or output signals are analog signals. This is often the case, for example, in the context of conventional speed or transmission (e.g., engine transmission) sensing systems. In at least some such conventional sensing systems, speed is sensed by detecting zero crossings of a magnetic field that occur as magnetic teeth on a wheel rotate past a magnetic sensor (e.g., a Hall sensor, an anisotropic magnetoresistance (AMR) sensor, a tunnel magnetoresistance (TMR) sensor, or a giant magnetoresistance (GMR) sensor) and induce change(s) in the output voltage of the magnetic sensor. In such embodiments, after each zero crossing, the supply current of the sensor is set to a new level. Additionally, in such embodiments, all calculations on the incoming signal are performed digitally, so the supply current can only change after an edge of the internal clock signal. This limits the accuracy of the zero-crossing detection, and the quantization in the time domain adds to the overall jitter of the system.

Referring to FIG. 1, a first graph 100, second graph 102, and third graph 104 collectively illustrate how variations in the timing of a clock signal relative to the timing of an input signal 106 can result in significantly different output signals and corresponding jitter. More particularly, the first graph 100, second graph 102, and third graph 104 respectively illustrate a first clock signal 108, second clock signal 110, and third clock signal 112, respectively. Although the first, second, and third clock signals 108, 110, and 112 share in common the same frequency, the three clock signals are slightly out of phase relative to one another. Consequently, as shown in the first, second, and third graphs 100, 102, and 104, the first, second, and third clock signals 108, 110, and 112 respectively have first, second, and third values 114, 116, and 118, respectively that differ from one another at a time 120 at which the input signal 106 crosses zero occurs. More particularly, the first value 114 of the first clock signal 108 is a minimum value of that clock signal at the time 120, the third value 118 of the third clock signal 112 is a maximum value of that clock signal at the time 120, and the second value 116 of the second clock signal 110 is a transitional (downward edge) value of that clock signal at the time 120 that can be considered to be in between (e.g., a zero value) of the second clock signal 110.

Because of this variation in the relative timing of the first, second, and third clock signals 108, 110, and 112 relative to one another and relative to the input signal 106, as further illustrated in FIG. 1 virtual phase error is introduced into output signals generated based upon the interplay of the input signal 106 and the clock signals 108, 110, and 112. More particularly, in the first graph 100, it can be seen that a first output signal 122 is step-shaped and includes a series of steps 124 that are each of equal height and width relative to the preceding step, that a first step 126 of the series of steps 124 occurs a first time differential 128 after the time 120, and that the series of steps has an effective slope represented by a dashed line 130. By comparison, in the second graph 102, it can be seen that a second output signal 132 also is step-shaped and includes a series of steps 134 that are each of equal height and width relative to the preceding step, that a first step 136 of the series of steps 134 occurs a second time differential 138 after the time 120, and that the series of steps has an effective slope represented by a dashed line 140. Additionally by comparison, in the third graph 104, it can be seen that a third output signal 142 also is step-shaped and includes a series of steps 144 that are each of equal height and width relative to the preceding step, that a first step 146 of the series of steps 144 occurs a third time differential 148 after the time 120, and that the series of steps has an effective slope represented by a dashed line 150.

In view of these considerations, as further illustrated in FIG. 1, the first, second, and third output signals 122, 132, and 142 are not in phase within one another even though the three output signals are all generated based upon the same input signal, namely, the input signal 106. More particularly, it can be seen from the first graph 100 that a first virtual starting point 152 of the first output signal 122, namely, the point at which the dashed line 130 crosses an initial (e.g., zero) level 154 of the first output signal, occurs a first time amount 156 in advance of the time 120. By contrast, it can be seen from the second graph 102 that a second virtual starting point 162 of the second output signal 132, namely, the point at which the dashed line 140 crosses an initial (e.g., zero) level 164 of the second output signal, occurs a second time amount 166 in advance of the time 120 that is less than the first time amount 156. And further by contrast, it can be seen from the third graph 104 that a third virtual starting point 172 of the third output signal 142, namely, the point at which the dashed line 150 crosses an initial (e.g., zero) level 174 of the third output signal, occurs a third time amount 176 in advance of the time 120 that is less than each of the first time amount 156 and the second time amount 166. Accordingly, because of the differences in the timing of the clock signals 108, 110, and 112, the output signals 122, 132, and 142 are out of phase relative to one another, and such differences correspond to the producing of jitter in the overall output signal during operation in which a given clock signal varies in its phase over time.

Although efforts have been made to develop modified systems and methods for signal processing to alleviate such concerns, such modified systems and methods have other disadvantages. For example, one manner of addressing the above-discussed problems relating to jitter and associated inaccuracy involves increasing the clock frequency to a level at which the clock is no longer the dominant jitter source. However, this strategy can result in increased total power consumption and necessitate higher timing constraints on the digital signal processing, neither of which are desirable.

For at least these reasons, therefore, it would be advantageous if one or more improved systems and methods for signal processing could be developed that addressed one or more of these concerns or disadvantages relating to jitter, and/or one or more other concerns or disadvantages.

DETAILED DESCRIPTION

The present disclosure encompasses a variety of embodiments of systems and methods for signal processing including, for example, systems and methods for processing speed sensing signals so as to reduce jitter or to avoid or reduce output signal variation notwithstanding phase variation in a clock signal. For example, such systems and methods allow for an output signal to be provided based at least indirectly upon an input signal and a clock signal in a manner so that, notwithstanding one or more phase changes in the clock signal, the output signal substantially or entirely retains a consistent phase relative to the input signal over a time period corresponding to a plurality of periods of the clock signal. Also, in at least some embodiments, the signal processing system employs, or the signal processing method involves, a pulse-shaping digital-to-analog converter (DAC) that is configured to reduce jitter (which otherwise might be caused by limited clock frequencies), by making use of a limited slope of an output pulse. By aligning a virtual starting point of the slope with an actual zero-crossing, the jitter can be reduced without increasing the clock frequency.

Further, in at least some embodiments, the present disclosure concerns a solution that reduces the effect of time quantization by internal clocking without increasing the clock frequency. To minimize emission, pulse shaping on the supply current is applied. Pulse shaping limits the slope of the output pulse. A slope between 8 mA/us and 26 mA/us is common for these types of sensors. The pulse shaping can be performed in a fully analog manner or with a DAC, but in both cases the slope begins after (or at a time of) an edge of the internal clock (that is, the same or substantially the same principles described herein as being applicable with respect to a DAC can also be utilized in achieving pulse shaping by way of a fully analog solution). In at least some embodiments, the first DAC step is adapted to make the virtual starting point of the slope independent of the clock phase, even though other DAC steps remain the same. With this approach the effect of time quantization can be substantially or completely compensated for or eliminated.

Figure 2:
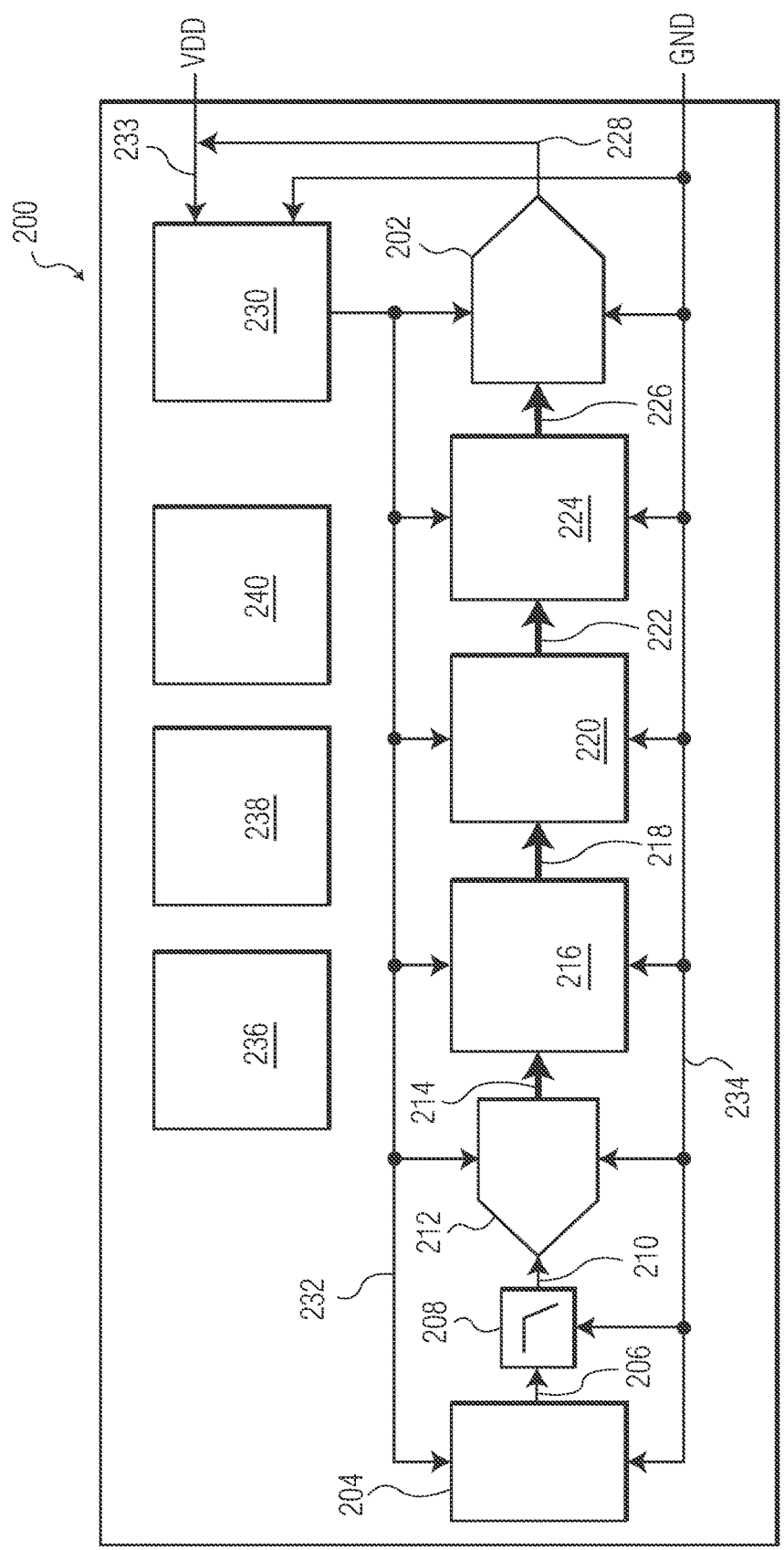
FIG. 2 is a schematic diagram showing an improved speed sensor system encompassing pulse shaping digital-to-analog converter (DAC) circuitry in accordance with an example embodiment encompassed herein.

Referring to FIG. 2, a schematic diagram is provided to show an improved speed sensor system 200 that includes a pulse-shaping digital-to-analog converter (DAC) 202 in accordance with an example embodiment encompassed by the present disclosure. More particularly shown, the speed sensor system 200 includes a sensor array 204 that detects or senses quantities or characteristics of a sensed device (for example, the magnetic field of a rotating wheel or other rotating component, not shown) and provides one or more output signals as represented by an arrow 206 to one or more signal processing or conversion components 208. The components 208, upon completion of appropriate conversion or processing, in turn output signals as represented by an arrow 210 to an analog-to-digital converter (ADC) 212. The ADC 212 converts the signals received from the components 208 from analog values into digital values that are output as digital signals as represented by an arrow 214.

Further as shown, the digital signals represented by the arrow 214 in turn are provided to offset correction circuitry 216, at which offset correction is performed and offset corrected signals are output as represented by an arrow 218. The offset corrected signals in turn are provided to zero crossing detection circuitry 220, at which a zero crossing detection operation is performed. Subsequently, zero crossing detection output signals as represented by an arrow 222 are provided from the zero crossing detection circuitry 222 to protocol generator circuitry 224. The protocol generator circuitry 224 in turn provides output signals represented by an arrow 226 to the pulse-shaping DAC 202. In turn, the pulse-shaping DAC 202 provides output signals, in the form of current signals as represented by an arrow 228, to terminals VDD and GND of the system 200.

The voltage regulator, as shown by an array of arrows 232 is coupled to each of the sensor array 204, the ADC 212, the offset correction circuitry 216, the zero correction detection circuitry 220, the protocol generator circuitry 224, and the pulse-shaping DAC 202. Also as shown, the regulator 230 is coupled to the terminal VDD as represented by an arrow 233, to which the pulse-shaping DAC 202 is coupled as discussed above (and which can also be coupled to, or be considered to constitute, a voltage source). Additionally, each of the regulator 230, sensor array 204, components 208, ADC 212, offset correction circuitry 216, zero crossing detection circuitry 220, protocol generator circuitry 224, and (as already mentioned above) pulse-shaping DAC 202 are all coupled to ground (the terminal GND) as well, as indicated by an array of arrows 234. In addition to the above-described components, the speed sensor system 200 further includes an oscillator 236, a NV memory 238, and an electro static discharge (ESD) protection circuitry 240. The oscillator 236 particularly serves to a provide a clock signal (not shown in FIG. 2) to the ADC 212, offset correction circuitry 216, zero crossing detection circuitry 220, protocol generator circuitry 224, and pulse-shaping DAC 202. Also, in at least some embodiments (and although not shown in FIG. 2), a reconstruction filter is employed after (e.g., at the output of) the pulse-shaping DAC 202. In such embodiments, such a filter can in some implementations have a bandwidth of approximately 1.5 MHz (albeit the bandwidth of the system is not really a limiting factor). Also, it should be appreciated that the clock on the receiver side will determine the overall performance of the system.

Figure 1:
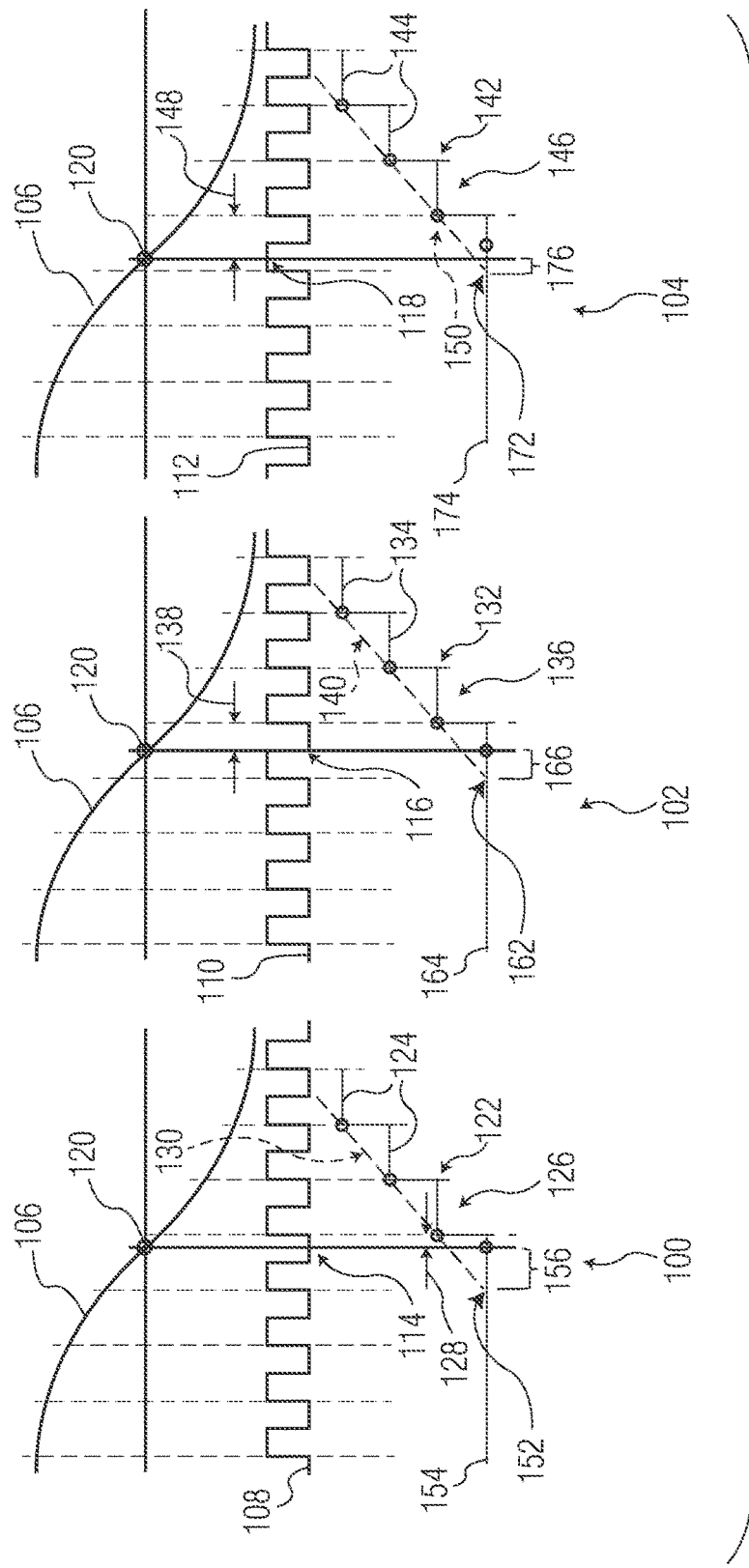
FIG. 1 shows three graphs illustrating in an exemplary manner the phase error that can be caused by a sampling clock during the operation of conventional sensing circuits.

In accordance with the present embodiment of FIG. 2, the sensing system 200 having the pulse-shaping DAC 202 provides an output signal (or output signals, e.g., as represented by the arrow 228) with reduced clock-induced jitter by comparison with conventional sensing systems. That is, although in conventional systems such as those represented by FIG. 1, variations in the phase or timing of a clock signal as illustrated by the clock signals 108, 110, and 112 can result in variations in an output signal as illustrated by the output signals 122, 132, and 142, implementation of a pulse-shaping DAC such as the DAC 202 fully or substantially eliminates such output signal variation. Example operation of the pulse-shaping DAC 202 to achieve such reduced-jitter or jitter-free performance is illustrated by FIG. 3.

Figure 3:
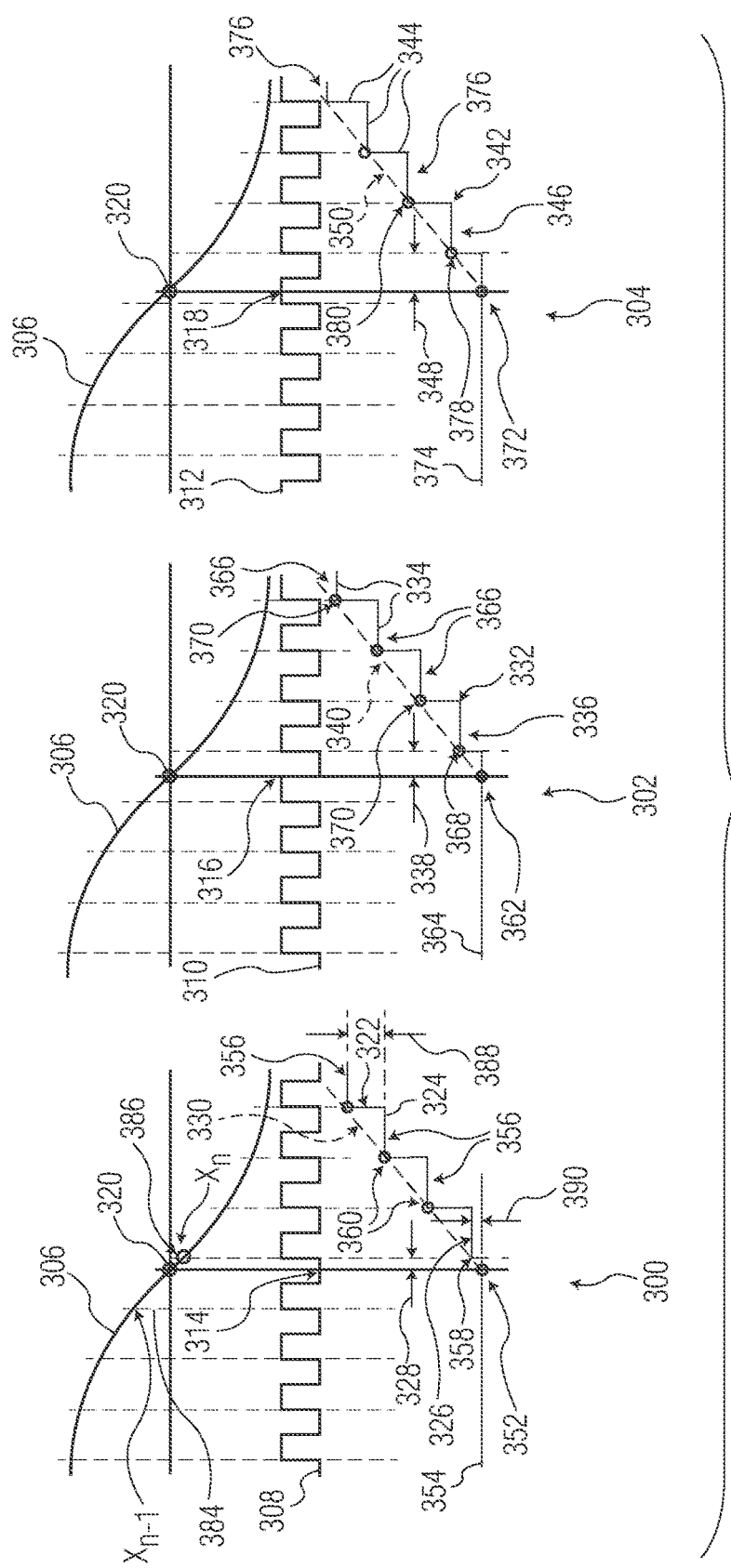
FIG. 3 shows three graphs illustrating phase error reduction that is achieved in improved speed sensor systems employing pulse shaping DAC circuitry such as that of FIG. 2.

More particularly, FIG. 3 shows a first graph 300, second graph 302, and third graph 304 that collectively illustrate how implementation of the pulse-shaping DAC 202 achieves output signals generated based upon an input signal 306 that are identical or substantially identical in terms of their timing notwithstanding variations in the timing of a clock signal used to generate those output signals. More particularly, the first graph 300, second graph 302, and third graph 304 respectively illustrate a first clock signal 308, second clock signal 310, and third clock signal 312, respectively, which share in common the same frequency but are slightly out of phase relative to one another. Consequently, as shown in the first, second, and third graphs 300, 302, and 304, the first, second, and third clock signals 308, 310, and 312 respectively have first, second, and third values 314, 316, and 318, respectively, which differ from one another at a time 320 at which the input signal 306 crosses zero. More particularly, the first value 314 of the first clock signal 308 is a minimum value of that clock signal at the time 320, the third value 318 of the third clock signal 312 is a maximum value of that clock signal at the time 320, and the second value 316 of the second clock signal 310 is a transitional (downward edge) value of that clock signal at the time 320 that can be considered to be in between (e.g., a zero value) of the second clock signal 310.

Notwithstanding this variation in the relative timing of the first, second, and third clock signals 308, 310, and 312 relative to one another and relative to the input signal 306, as further illustrated in FIG. 3 and explained below, output signals generated based upon the input signal 306 and the clock signals 308, 310, and 312 are effectively identical or substantially identical. More particularly, in the first graph 300, it can be seen that a first output signal 322 is step-shaped and includes a series of steps 324, that a first step 326 of the series of steps 324 occurs a first time differential 328 after the time 320, and that the series of steps has an effective slope represented by a dashed line 330. Each of the steps 324 has a respective leading edge that occurs simultaneously or substantially simultaneously with a corresponding rising edge of the first clock signal 308 subsequent to the time 320. Thus, each of the steps 324 has the same or substantially the same width corresponding to the period of the first clock signal 308.

By comparison, in the second graph 302, it can be seen that a second output signal 332 also is step-shaped and includes a series of steps 334, that a first step 336 of the series of steps 334 occurs a second time differential 338 after the time 320, and that the series of steps has an effective slope represented by a dashed line 340. Similar to the steps 324, each of the steps 334 has a respective leading edge that occurs simultaneously or substantially simultaneously with a corresponding rising edge of the second clock signal 310 subsequent to the time 320. Thus, each of the steps 334 has the same or substantially the same width corresponding to the period of the second clock signal 310. Additionally by comparison, in the third graph 304, it can be seen that a third output signal 342 also is step-shaped and includes a series of steps 344, that a first step 346 of the series of steps 344 occurs a third time differential 348 after the time 320, and that the series of steps has an effective slope represented by a dashed line 350. Similar to the steps 324 and 334, each of the steps 344 has a respective leading edge that occurs simultaneously or substantially simultaneously with a corresponding rising edge of the third clock signal 312 subsequent to the time 320. Thus, each of the steps 344 has the same or substantially the same width corresponding to the period of the third clock signal 312.

Inspection of the first, second, and third output signals 322, 332, and 342 shows that those three output signals do differ from one another in certain respects. In particular, it should be appreciated that, although each of the first steps 326, 336, and 346 are identical or substantially identical in width (e.g., in temporal extent), the first step 326 of the first output signal 322 is shorter in height than the first step 336 of the second output signal 332, and each of the first and second steps 326 and 336 of the first and second output signals 322 and 332, respectively, is shorter in height than the first step 346 of the third output signal 342. This is in contrast to the heights of subsequent steps 356, 366, and 376, respectively, of the first, second, and third output signals 322, 332, and 342, respectively, all of which are shown to be identical to one another in terms of their height (relative to the preceding step) and width.

Yet notwithstanding the differences of the heights of the respective first steps 326, 336, and 346 of the first, second and third output signals 322, 332, and 342, respectively, it should additionally be appreciated that the dashed lines 330, 340, and 350, are all identical or substantially identical. More particularly, it should be appreciated that first, second, and third virtual starting points 352, 362, and 372, respectively, through which the dashed lines 330, 340, and 350 respectively pass, not only are respectively aligned with respective initial (zero) levels 354, 364, and 374 of the first, second, and third output signals 322, 332, and 342, respectively, but also are all aligned (or substantially aligned) in time with the time 320 at which the input signal 306 experiences a zero crossing. Further, it should also be appreciated that the dashed lines 330, 340, and 350, which effectively represent the respective slopes of the first, second, and third output signals 322, 332, and 342, respectively, all have an identical or substantially identical slope. Thus, in terms of their virtual starting points 352, 362, and 372 and their trajectories represented by the dashed lines 330, 340, and 350, the first, second, and third output signals 322, 332, and 342 are substantially identical to one another. Relatedly, to the extent that the dashed lines 330, 340, and 350 are considered to be the true output signals (rather than the signals 322, 332, and 342), all of those output signals are identical or substantially identical.

From FIG. 3, it should additionally be recognized that the first, second, and third output signals 322, 332, and 342 are substantially identical to one another, and that the dashed lines 330, 340, and 350 are identical or substantially identical to one another, because of the particular characteristics of the steps 324, 334, and 344. As shown, the first steps 326, 336, and 346 of FIG. 3 occur in time subsequent to the time 320 and particularly step up (e.g., have rising edges) at the same or substantially the same times, respectively, as respective rising edges of the respective clock signals 308, 310, and 312 first occur after the time 320. However, the heights of the first steps 326, 336, and 346 respectively have varying values that are related to the extent of the time differentials 328, 338, and 348, respectively. The heights are particularly set so that the slopes of the dashed lines 330, 340, and 350 are identical or substantially identical to one another as those dashed lines extend from the respective virtual starting points 352, 362, and 372, respectively, to respective leading top corners 358, 368, and 378 of the first steps 326, 336, and 346, respectively.

Further, the respective slopes of the respective dashed lines 330, 340, and 350 established by the respective virtual starting points 352, 362, and 372 and the respective leading top corners 358, 368, and 378 also are consistent with subsequent steps 356, 366, and 376, respectively, of the output signals 322, 332, and 342, respectively. Indeed, as shown, the respective dashed lines 330, 340, and 350 not only extend from the respective virtual starting points 352, 362, and 372 to the respective leading top corners 358, 368, and 378, respectively, but also extend without any change in their slopes to successive leading top corners 360, 370, and 380, respectively, of the subsequent steps 356, 366, and 376, respectively.

The heights of first steps of output signals such as the first steps 326, 336, and 346 can be calculated in a variety of manners depending upon the embodiment. In the present embodiment of FIG. 3, in which it is assumed that there are high oversampling ratios, the input signal 306 can be assumed to be linear between sampling moments around the zero crossing, where the sampling moments are times coinciding with the rising edges of the clock signal at which the input signal is sampled. For example, with respect to the first graph 300, the sampling moments around the zero crossing include a time 384 coinciding with the rising edge of the first clock signal 308 preceding the time 320 at which a zero crossing occurs that is closest to that time 320, and also a time 386 coinciding with the rising edge of that clock signal occurring subsequent to the time 320 that is closest to that time 320.

Using these sampled moments and the aforementioned assumption of linearity, the clock phase can be calculated based upon the sampled value at the time 384 just before the zero crossing ($X_{n-1}$) and the sampled value at the time 386 just after the zero crossing ($X_n$), as $X_n/(X_n-X_{n-1})$. Further, with such a known (calculated) clock phase determined based upon $X_n$ and $X_{n-1}$, an adjusted height 390 of the first step 326 used by the DAC, represented by a variable $LSB_{first}$ (first Least Significant Bit) can be calculated based upon the clock phase and a standard height 388 of the subsequent steps 356 of the output signal 322, represented by a variable $LSB_{nom}$ (nominal Least Significant Bit) by way equation (1) as follows:

$$LSB_{first}=X_n/(X_n \times X_{n-1}) \cdot LSB_{nom} \qquad (1).$$

Although corresponding sample moments before and after the zero crossing at the time 320, and adjusted and standard heights corresponding to the adjusted height 390 and standard height 388 of the first graph 300, are not labeled with reference numerals in the second graph 302 and 304, nevertheless the adjusted heights of the first steps 336 and 346 can be calculated in the same manner as described above using equation 1. In particular, it should be appreciated that the standard heights of the subsequent steps 366 and 376 in the present example are identical or substantially identical to the standard height 388. Further, the sample values $X_{n-1}$ and $X_n$ in the case of the graph 302 will be the values of the input signal 306 at the sample moments coinciding with the rising edges of the clock signal 310 that are closest to the time 320, respectively preceding and occurring subsequent to the time 320. Likewise, the sample values $X_{n-1}$ and $X_n$ in the case of the graph 304 will be the values of the input signal 306 at the sample moments coinciding with the rising edges of the clock signal 312 that are closest to the time 320, preceding and occurring subsequent to the time 320. Notwithstanding the above description, it should also be appreciated that, in alternate embodiments, other (e.g., non-linear) interpolation techniques can also be used.

Thus, FIG. 3 illustrates a manner of operation in which, by virtue of employing a variable first DAC step, the virtual starting point of the effective slope of the output signal can be perfectly (or substantially perfectly) aligned with the actual zero crossing of the input signal. Consequently, even though the timing (and relative phases) of the first, second, and third clock signals 308, 310, and 312 are different from one another, the first, second and third output signals 322, 332, and 342 still are identical or substantially identical. Therefore, assuming operation of the pulse-shaping DAC 202 occurs in this manner, variation in the timing or phase of a clock signal (e.g., so that the clock signal takes on, at different times, the different timing of the clock signals 308, 310, and 312) does not result in corresponding phase variation, or jitter, in the resulting output signal. To the contrary, the resulting output signal retains the same or substantially the same timing or phase relative to the input signal 306, and particularly relative to zero crossings of the input signal 306 such as that illustrated at the time 320, regardless of variations in the timing or phase of the clock signal used to generate that output signal.

Although not shown in FIG. 3, it should be appreciated that the output signals 322, 332, and 342 (and corresponding dashed lines 330, 340, and 350, respectively) do not continue indefinitely upward, with an endless number of ongoing ones of the subsequent steps 356, 366, and 376, respectively. Rather, at some point within the given period (or half-period) of the input signal 306 that began at the time 320, the output signals 322, 332, and 342 return to the respective initial (zero) levels 354, 364, and 374, so as to be reset. Then, subsequently, at a next time corresponding to the next zero-crossing of the input signal 306, the output signals 322, 332, and 342 can again experience first steps having adjusted heights as described above, followed by subsequent steps having standard heights. Given this to be the case, it should be further appreciated that (though not shown in FIG. 3) each of the output signals 322, 332, and 342 has a respective final step, prior to returning to the respective initial level 356, 364, and 374. In at least some embodiments, this final step can have a height that differs from the standard height 388. In other words, because the first DAC step has a variable height, also the last DAC step can be adjustable, for example, to achieve an end value (e.g., highest value) of the output signal that is at a particular desired level. For example, in some such embodiments, each respective final step can have a height that is equal to the difference between the standard height and the adjusted height of the preceding first step, so that the overall rise in the output signal from its initial level to its final level is a multiple of the standard height. Further for example, with respect to the output signal 322 of the first graph 300, the height of the final step of that output signal prior to its returning to the initial level 354 can be equal to the difference between the standard height 388 and the adjusted height 390. The standard height 388, and correspondingly the adjusted height 390 as well as the difference between the standard and adjusted heights, can have a variety of values depending upon the embodiment. For example, in some embodiments, consistent with some speed sensor applications and in accordance with the AK protocol, supply current steps (e.g., corresponding to the standard height 388) from 7 mA (milliAmperes) to 14 mA, or from 7 mA to 28 mA, can occur after a zero-crossing is detected.

Figure 4:
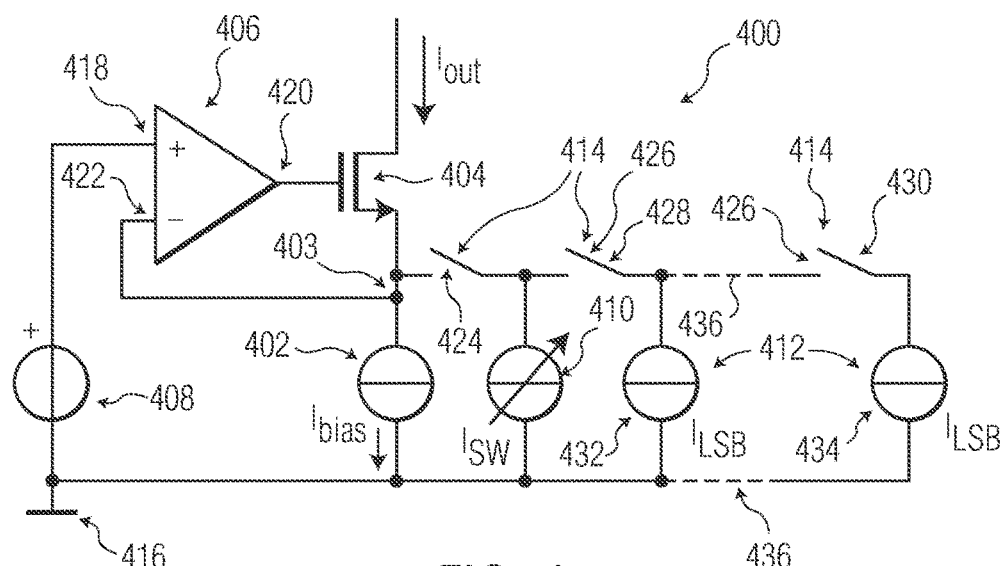
FIG. 4 is a schematic diagram showing, in a generalized form, a current-domain topology of DAC circuitry that can be implemented in the speed sensor system of FIG. 2.
Figure 5:
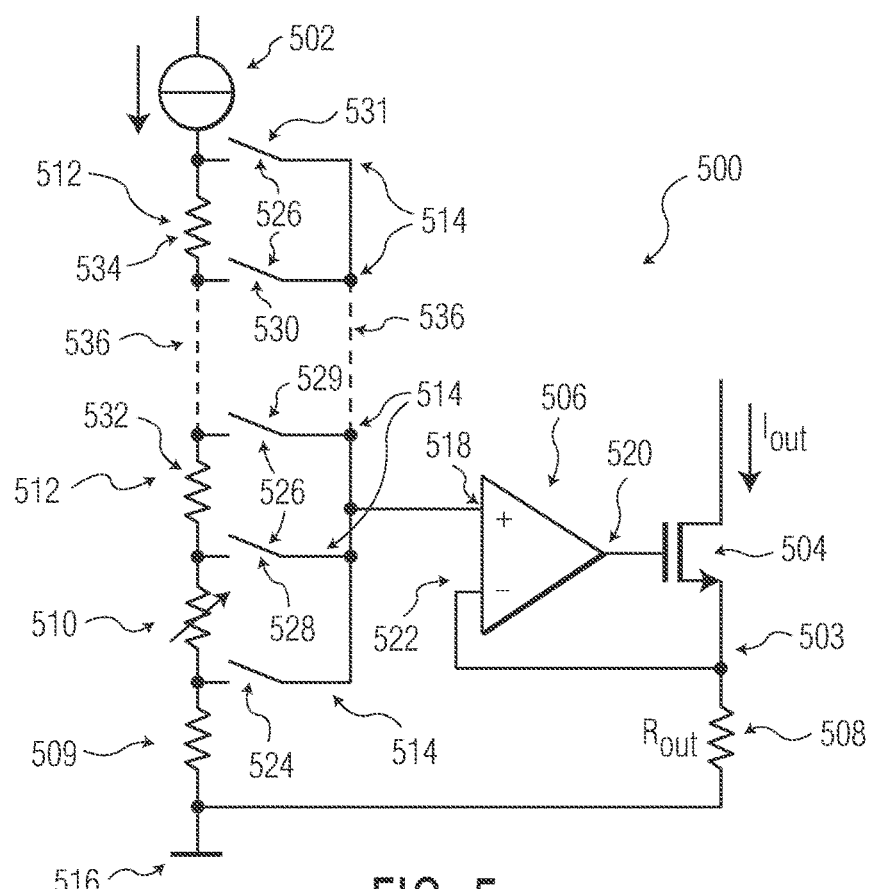
FIG. 5 is a schematic diagram showing, in a generalized form, a voltage-domain topology of DAC circuitry that can be implemented in the speed sensor system of FIG. 2.
Figure 6:
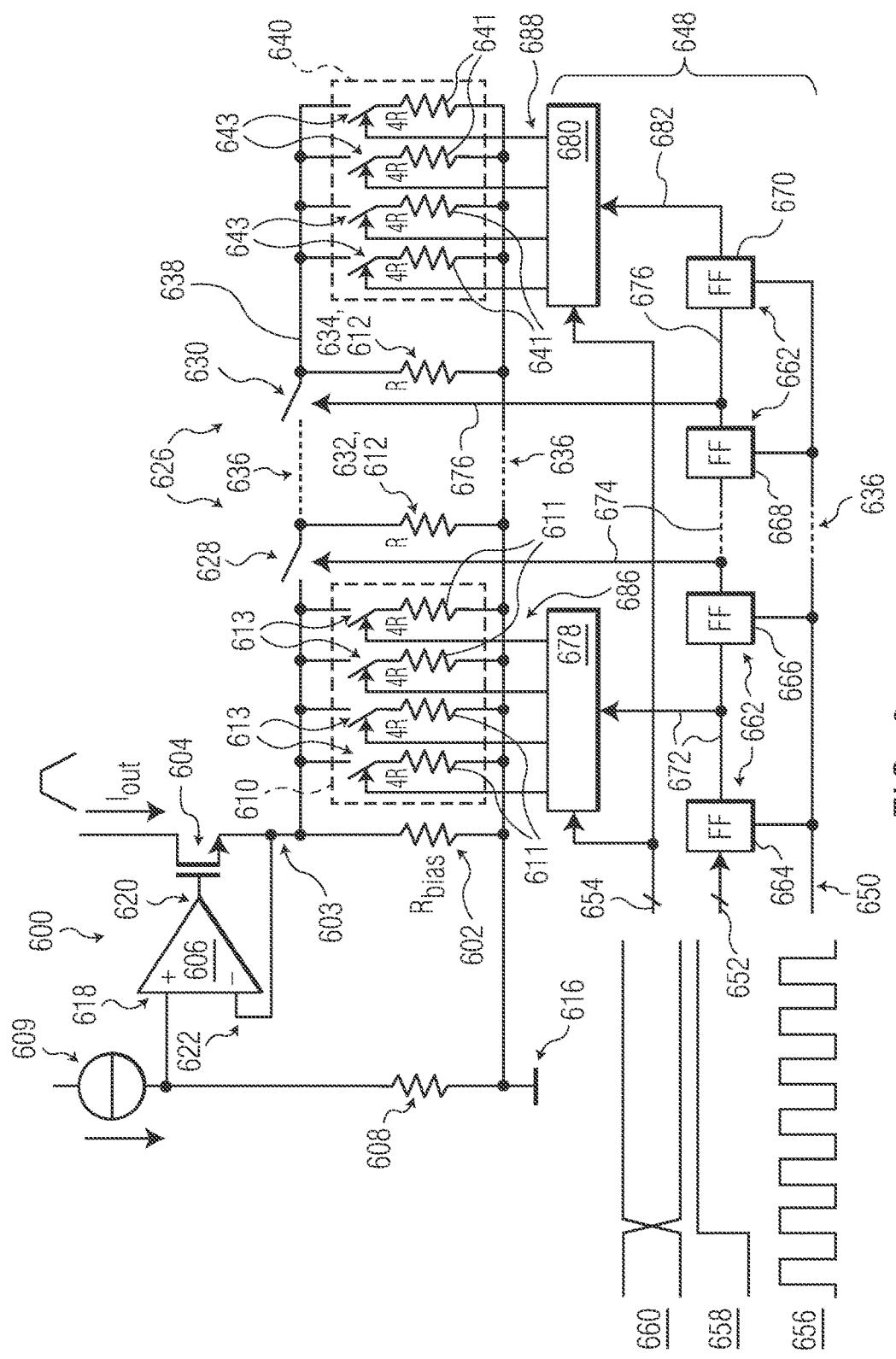
FIG. 6 is a schematic diagram showing an additional current-domain topology of DAC circuitry that can be implemented in the speed sensor system of FIG. 2.
Figure 7:
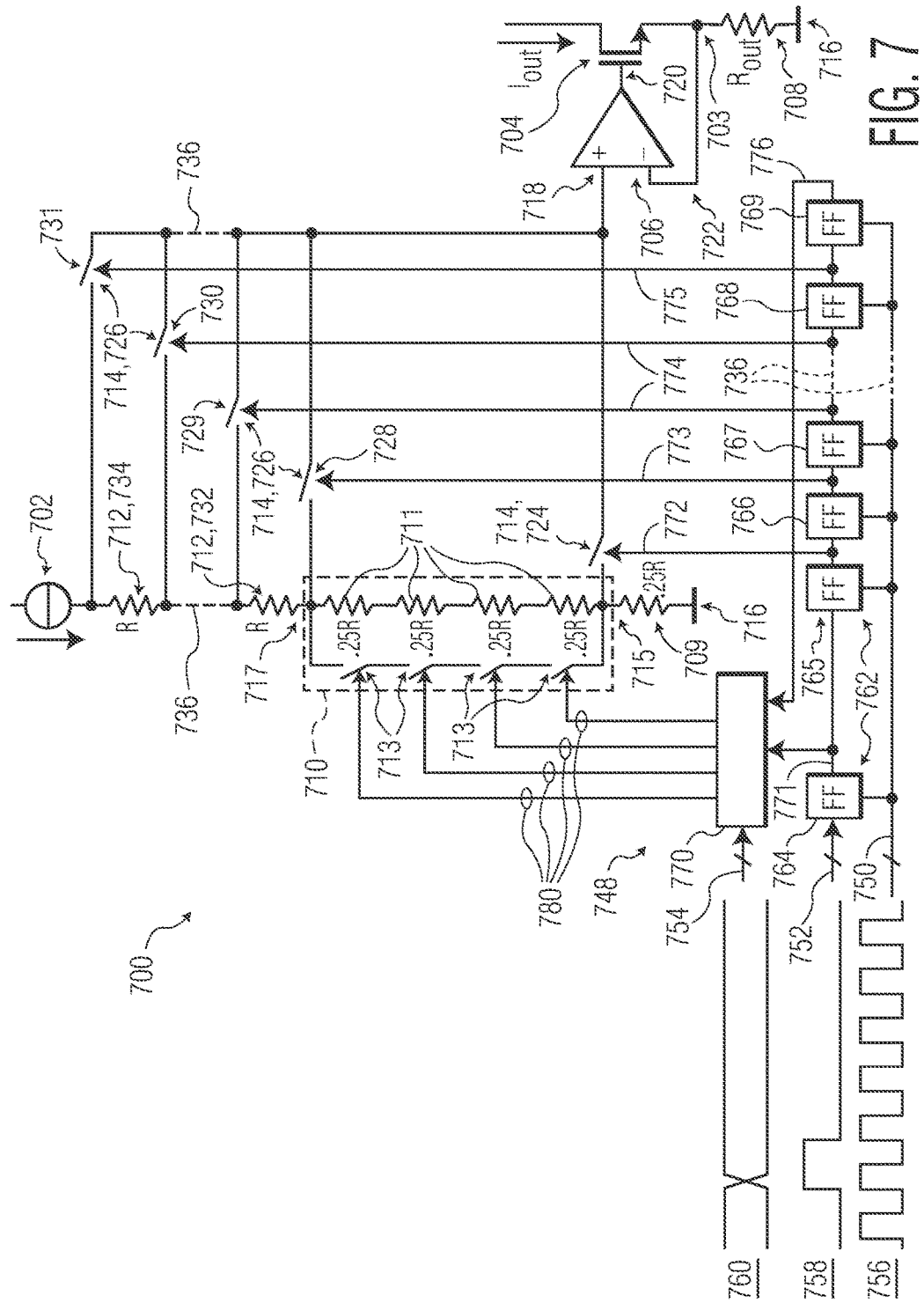
FIG. 7 is a schematic diagram showing an additional voltage-domain topology of DAC circuitry that can be implemented in the speed sensor system of FIG. 2.

Turning to FIGS. 4, 5, 6, and 7, as mentioned above, the DAC 202 of FIG. 2 can take any of a variety of forms depending upon the embodiment, and the present disclosure is intended to encompass numerous different embodiments of such a device (or system or circuit component). Several such example embodiments are shown in each of FIG. 4, FIG. 5, FIG. 6, and FIG. 7 herein. As described in further detail below, the embodiments of pulse-shaping DACs shown in FIG. 4 and FIG. 6 are embodiments having topologies that are current domain topologies. By comparison, the embodiments of FIGS. 5 and 7 are embodiments having topologies that are voltage domain topologies. Notwithstanding the particular example embodiments of pulse-shaping DACs shown in FIGS. 4, 5, 6, and 7, the present disclosure is intended to encompass numerous other alternate embodiments of pulse-shaping DACs as well.

In the example embodiment shown in FIG. 4, the output DAC 202 takes the form of a current domain DAC 400 that is constructed directly in the current domain. As shown, the current domain DAC 400 includes a small fixed current source 402, a N-channel metal oxide semiconductor field effect transistor (MOSFET) 404, an operational amplifier 406, a voltage source 408, a switchable current source 410, a plurality of additional current sources 412, and a plurality of switches 414.

As shown, the voltage source 408 is coupled between a ground terminal 416 and a non-inverting terminal 418 of the operational amplifier 406. An output terminal 420 of the operational amplifier 406 is coupled to the gate of the MOSFET 404, and an inverting terminal 422 of the operational amplifier is coupled to a source of the MOSFET 404. The inverting terminal 422 and source of the MOSFET 404 can be considered to form a node 403. As further shown, the current source 402 is coupled to the node 403, between that node and the ground terminal 416, and drives a biasing current $I_{bias}$. Additionally, a first switch 424 of the plurality of switches 414 is coupled between the node 403 and the switchable current source 410, which is coupled between the first switch 424 and the ground terminal 416. Given this arrangement, the first switch 424 and switchable current source 410 together constitute a component that is coupled in parallel with the current source 402, and the switchable current source 410 particularly can be coupled in parallel with or decoupled from (so as to not be coupled in parallel with) the current source 402 depending upon the status of the first switch 424.

Additionally as shown, the plurality of switches 414 not only includes the first switch 424 but also includes one or more additional switches 426 that, in the present example embodiment, include a first additional switch 428 and a second additional switch 430. In general, each of the additional switches 426 is coupled in series with a respective one of the additional current sources 412 that each is configured to drive a current $I_{LSB}$ and that, in the present example embodiment, include a first additional current source 432 and a second additional current source 434. More particularly as shown, the series-coupled first additional switch 428 and first additional current source 432 together constitute a component that is coupled in parallel with the switchable current source 410, between the ground terminal 416 and the node linking the first switch 424 and the switchable current source 410. Similarly, the series-coupled second additional switch 430 and second additional current source 434 together constitute a component that is coupled in parallel with the first additional current source 432, between the ground terminal 416 and the node linking the first additional switch 428 and the first additional current source 432. Given this arrangement, it will be appreciated that, depending upon the actuation of the first switch 424, the first additional switch 428, and the second additional switch 430, the current source 402 not only can be operated in parallel with the switchable current source 410 alone but also can be operated in parallel with either the first additional current source 432 or both the first and second additional current sources 432 and 434.

Although the embodiment of FIG. 4 particularly shows two of the additional switches 426 and two of the additional current sources 412, in other embodiments there can be any arbitrary number (one or more) of these additional switches and current sources. Dashed lines 436 shown in FIG. 4 particularly are provided to illustrate that it is envisioned that, in at least some embodiments, more than two of the additional switches 426 and more than two of the additional current sources 412 are present. As shown, the dashed lines 436 particularly link the second additional current source 434 to the node of the first additional current source 432 that is coupled to the ground terminal 416, and link the second additional switch 430 to the node linking the first additional switch 428 and the first additional current source 432. Thus, the dashed lines 436 are intended to indicate that one or more circuit portions or components including a respective series-coupled additional switch and additional current source can be coupled in between the series-coupled first additional switch 428 and first additional current source 432 or in between the series-coupled second additional switch 430 and second additional current source 434.

In the present embodiment, the switchable current source 410 can be dynamically scaled to the clock phase. That is, a switchable current $I_{SW}$ can be modified to take on a variety of values in accordance with clock phase. By contrast, each of the additional current sources 412 drives a current $I_{LSB}$ of fixed value. Thus, depending upon the actuation of the switches 414, the current driven between the ground terminal 416 and the node 403 can be any of $I_{bias}$, $I_{bias}$ plus $I_{SW}$, $I_{bias}$ plus $I_{SW}$ and $I_{LSB}$, and $I_{bias}$ plus each of $I_{SW}$ and two times $I_{LSB}$. Additionally, in alternate embodiments the number of each of the additional current sources 412 and the associated additional switches 426 can be a number n other than two. In such embodiments, depending upon the actuation of the switches 414, the current driven between the node 403 and the ground terminal 416 can be any of $I_{bias}$, $I_{bias}$ plus $I_{SW}$, and $I_{bias}$ plus each of $I_{SW}$ and n times $I_{LSB}$, where n can take on each of any value 1 to n. It should be appreciated that the operational amplifier 406 is provided to keep the voltage across the current sources constant, which will relax the specification on the output resistance of the current sources (with the voltage being defined by the voltage source 408).

Based upon a comparison of FIG. 3 and FIG. 4, it should be appreciated that the circuit of FIG. 4 is capable of operating to generate an output signal $I_{out}$ that corresponds to any of the output signals 322, 332, and 342, and that this is achieved by varying the value of $I_{SW}$ and the timing of the actuation of the switches 414 depending upon the phase of the clock signal. More particularly, the value of $I_{SW}$ and the timing of the closing of the first switch 424 are set or modified so that the combination of $I_{SW}$ and $I_{bias}$ can produce a first step in the output signal $I_{out}$ that is consistent with having a virtual starting point that occurs at the time 320, regardless of the timing of the clock signal. For example, in order to achieve the output signals 322, 332, and 342, respectively, notwithstanding variation in the clock signal among the clock signals 308, 310, and 312, respectively, the first switch 424 is actuated to be closed at three different times corresponding to the time differentials 328, 338, and 348 occurring after the time 320 so as to couple the switchable current source 410 in parallel with the current source 402. With such actuation at those three different times associated with the time differentials 328, 338, and 348, respectively, the respective output signals 322, 332, and 342 take on the values of the first steps 326, 336, and 346, respectively.

Subsequent to the actuation of the first switch 424, the additional switches 426 are then successively actuated so as to be closed at appropriate times corresponding to the successive leading edges of the clock signal. By virtue of the successive closing of the additional switches 426, successive currents provided by the respective additional current sources 412 each in the amount of $I_{LSB}$ are added to the combination of $I_{SW}$ and $I_{bias}$ so as to generate subsequent steps of the output signal $I_{out}$. For example, in regard to the example of FIG. 3, the successive closing of the additional switches 424 results in the occurring of the subsequent steps 356, 366, or 376, respectively, depending upon whether the clock signal has the phase of the clock signal 308, the clock signal 310, or the clock signal 312, respectively. It should be appreciated that the number of subsequent steps that occur following a first step of the output signal can generally match the number of additional switches and corresponding additional current sources that are present in a DAC such as the DAC 400. Therefore, the DAC 400 as particularly shown in FIG. 4 with two of the additional current sources 412 and two of the additional switches 426 (and ignoring the implications of the dashed lines 436) is configured to produce output signals having three steps. Alternatively, to achieve operation in which each of the subsequent steps 356, 366, or 376 of the output signals 322, 332, or 342, respectively, include more than two steps (e.g., at least three steps), in actuality the DAC 400 will include more than two (e.g., at least three) of the additional switches 426 and more than two of the additional current sources 412.

Although not shown in FIGS. 3 and 4, it should further be understood that, in at least some embodiments, it will be desired that the output signal attain (or not surpass) a maximum value (or consistent end value) prior to returning to an initial value. For example, it may be desired that such a maximum value of the output signal $I_{out}$ occurs when a current equaling the sum of $I_{bias}$ and three times $I_{LSB}$ flows between the node 403 and the ground terminal 416. To achieve such desired behavior, a modified version of the DAC 400 of FIG. 4 can be appropriate. More particularly, to achieve such desired behavior, the additional current sources 412 will include a final (in this example, third) current source in addition to the additional current sources 432, 434, and the additional switches 426 will include a final (in this example, third) switch in addition to the additional switches 428, 430. In such embodiment, the series-connected final switch and final current source will be coupled in parallel with the current source 434, between the ground terminal 416 and the node linking the additional switch 430 and the additional current source 434. Further, the final current source will be an additional switchable current source (rather than a fixed current source) that is configured to generate a final current $I_{FIN}$ that is equal to $I_{LSB}$ minus $I_{SW}$. Notwithstanding this particular example embodiment, in other embodiments, the maximum value of the output Iout can be any arbitrary number or value, and the number of additional switches and additional current sources and the exact current generation provided by any final current source can be modified to achieve such maximum value.

The DAC 400 is a "current domain" arrangement in that control over the output signal $I_{out}$ is determined by governing the amount of current flowing between the node 403 and the ground terminal 416. Nevertheless, the DAC 202 can also take the form of a "voltage domain" arrangement. One example of such an arrangement is a DAC 500 shown in FIG. 5. In this example, the DAC 500 includes a biasing current source 502, a N-channel MOSFET 504, an operational amplifier 506, an output resistor 508 with a resistance $R_{out}$, a base resistor 509, a switchable or variable resistor 510, a plurality of additional resistors 512, and a plurality of switches 514. As shown, the base resistor 509 and the output resistor 508 are both coupled to a ground terminal 516. Further, the operational amplifier 506 includes a non-inverting terminal (or port) 518, an output terminal 520 and an inverting terminal 522, where the output terminal 520 is coupled to the gate of the MOSFET 504. Also, a node 503 links the source of the MOSFET 504 with each of the inverting terminal 522 and the output resistor 508, which is coupled between the node 503 and the ground terminal 516. A current $I_{out}$ flowing with respect to the drain of the MOSFET 504 constitutes the output current of the DAC 500 and can be considered the output signal of the DAC that corresponds for example to any of the output signals 322, 332, and 342 of FIG. 3.

As further shown, the base resistor 509, switchable resistor 510, and each of the resistors of the plurality of additional resistors 512 are coupled in series with one another between the ground terminal 516 and the biasing current source 502. The base resistor 509 particularly is coupled between the switchable resistor 510 and the ground terminal 516, and the switchable resistor 510 is coupled between the base resistor 509 and a first additional resistor 532 of the plurality of additional resistors 512. The first additional resistor 532 is coupled between a second additional resistor 534 of the plurality of additional resistors 512, which in turn is coupled between the first additional resistor 532 and the biasing current source 502. Additionally, each of the switches 514 is coupled between a respective node linking a respective pair of the resistors 509, 510, and 512 and the non-inverting input terminal 518 of the operational amplifier 518.

More particularly, a first switch 524 of the switches 514 is coupled between node linking the base resistor 509 and the switchable resistor 510 and the non-inverting input terminal 518. Additional switches 526 in turn are coupled between others of the nodes between the resistors 510 and 512 and the non-inverting terminal 518. More particularly, a first additional switch 528 of the additional switches 526 is coupled between the non-inverting terminal 518 and the node linking the switchable resistor 510 and the first additional resistor 532, a second additional switch 529 of the additional switches 526 is coupled between the non-inverting terminal 518 and the node of the first additional resistor 532 that is linked to the second additional resistor 534, a third additional switch 530 of the additional switches 526 is coupled between the non-inverting terminal 518 and the node of the second additional resistor 534 that is linked to the first additional resistor 532, and a fourth additional switch 531 of the additional switches 526 is coupled between the non-inverting terminal 518 and the node linking the second additional switch 534 and the biasing current source 502.

Additionally, dashed lines 536 are shown to couple the aforementioned nodes of the first and second additional resistors 532, 534 to which the second and third additional switches 529, 530 are coupled, and to couple the opposite terminals of those second and third additional switches 529, 530 so that both of those switches are coupled to the non-inverting terminal 518. The presence of the dashed lines 536 is intended to signify that any arbitrary number n of the additional resistors 512 (and particularly any arbitrary number n>1) can be present depending upon the embodiment, and also to signify that correspondingly any arbitrary number n>2 (or alternatively n>1) of the additional switches 526 can be present depending upon the embodiment.

Given this arrangement, the DAC 500 also can serve the same or substantially the same purpose as the DAC 400 in terms of generating the output signal $I_{out}$ in a manner that does not vary (or substantially vary) depending upon the timing or phase of the clock signal. Although the base (lowest) resistor 509 merely serves a purpose of biasing the MOSFET (output transistor) 504 with a minimum current, the switchable resistor 510 allows for variations in the first step of the output signal, and corresponding variations in the virtual starting point of the output signal (such as the virtual starting points 352, 362, and 372). More particularly, in this embodiment employing a switch matrix involving the switches 514, the voltage on the non-inverting (positive) input terminal 518 of the operational amplifier 506 can be selected through variation in the resistance provided by the switchable resistor 510 and actuation (closing and opening) different ones of the switches 514. Due to the high gain of the operational amplifier 506, the voltage on the output resistor 508 (with the resistance $R_{out}$) will be equal to the selected voltage. In turn, the output signal $I_{out}$ will be proportional to the reference current 502 (and scale with the selected voltage).

In particular, an initial value of the output signal $I_{out}$ occurs when the first switch 524 is closed (short-circuited) and all of the others of the switches 514 are opened (open-circuited). Additionally, a first step in the output signal $I_{out}$ such as any of the first steps 326, 336, and 346 of FIG. 3 can occur when it is the first additional switch 528 that is closed and all of the others of the switches 514 are opened. Further, subsequent steps of the output signal $I_{out}$ such as any of the subsequent steps 356, 366, and 376 of FIG. 3 can occur as other ones of the additional switches 526 are closed while all of the others of the switches 514 are opened.

Additionally, although not shown in FIGS. 3 and 5, it should again be understood that, in at least some embodiments, it will be desired that the output signal attain (or not surpass) a maximum value (or consistent end value) prior to returning to an initial value. To achieve such desired behavior, a modified version of the DAC 500 of FIG. 5 can be appropriate. More particularly, to achieve such desired behavior, the additional resistors 512 will include a final (in this example, third) additional resistor in addition to the additional resistors 532, 534, and the additional switches 526 will include a final (in this example, fifth) additional switch to supplement the additional switches 528, 529, 530, 531. In such embodiment, the final additional resistor will be coupled between the current source 502 and the second additional resistor 534, and the final additional switch will be coupled between the non-inverting terminal 518 and the node linking that current source and final additional resistor. Further, in such embodiment, the final resistor will be an additional switchable or variable resistor (rather than a fixed resistor) that is adjustable to the phase of the clock. It should be appreciated that the maximum value of the output current $I_{out}$ can be any arbitrary number or value, and the number of additional resistors and additional switches, as well as the degree to which the final resistor can be varied in terms of its resistance, can be modified to achieve such maximum value.

Turning to FIG. 6 and FIG. 7, respectively, additional schematic diagrams show further examples of the DAC 202, namely, a DAC 600 and a DAC 700, respectively. It should be appreciated that the DAC 600 of FIG. 6 is similar to the DAC 400 of FIG. 4 in that it is a current domain arrangement, and that the DAC 700 of FIG. 7 is similar the DAC 500 of FIG. 5 in that it is a voltage domain arrangement. As such, many of the components of the DAC 600 are identical, substantially similar, or analogous to many of the components of the DAC 400, and likewise many of the components of the DAC 700 are identical, substantially similar, or analogous to many of the components of the DAC 500. At the same time, the DACs 600, 700 of FIGS. 6 and 7 show in greater detail certain control components, including a plurality of decoders and flip-flops (FFs), which can be employed to control the timing of the opening and closing of switching components that are present in the DACs. Such control components are merely exemplary and, in other embodiments, other types of control components or circuitry (e.g., a microprocessor) can be employed. Although not shown in FIGS. 4 and 5, it should be recognized that the DACs 400 and 500 also will typically be operated in conjunction with, and controlled by way of, control components or circuitry such as that of FIGS. 6 and 7 or otherwise.

More particularly as shown, the DAC 600 has a N-channel MOSFET 604 and an operational amplifier 606 that are (or can be) identical to the MOSFET 404 and operational amplifier 406. In this arrangement, a current $I_{out}$ flowing in relation to a drain of the MOSFET 404 is the output signal of the DAC, an output terminal 620 of the operational amplifier 606 is coupled to a gate of the MOSFET 604, and a node 603 links an inverting terminal 622 of the operational amplifier with a source of the MOSFET 604. A non-inverting terminal 618 of the operational amplifier 606 is coupled to a ground terminal 616 by way of a resistor 608, and a current source 609 also coupled to the non-inverting terminal 618 drives a current through the resistor 608 so as to produce a voltage on the non-inverting terminal such that the arrangement of the resistor 608 and current source 609 can be considered analogous to the voltage source 408 of FIG. 4. A biasing current corresponding to the current $I_{bias}$ of FIG. 4 is provided by the coupling of a resistor 602 with a resistance $R_{bias}$ between the node 603 and the ground terminal 616.

Additionally, a subcircuit 610 is also coupled in parallel with the resistor 602 between the node 603 and the ground terminal 616 and serves the role of the switchable current source 410 of FIG. 4. In the embodiment of FIG. 6, the subcircuit 610 particularly is formed by the combination of four switchable resistors 611 and four series-connected switches 613. As shown, each of the switchable resistors 611 is coupled between the ground terminal 616 and the node 603 by way of a respective one of the series-connected switches 613, with the switch being connected between the node 603 and the respective resistor. The resistance of each of the switchable resistors 611 can be an arbitrary number, and in some embodiments the resistances of the different resistors can be of equal value or take on different values, although in the present embodiment the resistances are all equal (shown as 4 R).

Control of the switching (closed/open) status of each of the switches 613 causes the respective switchable resistors 611 to be coupled in parallel with the resistor 602 or decoupled from the node 603, such that the effective resistance provided by the subcircuit 610 can be varied. Correspondingly, the current flowing through the subcircuit 610 can be varied, and can be considered a switchable current corresponding to the current $I_{SW}$ of FIG. 4. It is noteworthy that, in the embodiment of FIG. 6 in which each of the resistors 611 is individually associated with a respective one of the switches 613, there is no further switch present in between the node 603 and the switches 613 of the subcircuit 610 that would specifically correspond to the switch 424 of FIG. 4. Rather, the switches 613 can be understood as serving both the purpose of the switch 424, in terms of controlling timing or actuation, as well as allowing for and governing the variation in the current passing through the subcircuit 610.

In addition, the DAC 600 also includes a plurality of (again, in this example, two) additional switches 626 and a plurality of (in this example, two) additional resistors 612. In the present example embodiment, a first additional resistor 632 of the additional resistors 612 is coupled in series between the ground terminal 616 and a first additional switch 628 of the additional switches 626, which is coupled between the first additional resistor 632 and the node 603. Also, a second additional resistor 634 of the additional resistors 612 is coupled in series between the ground terminal 616 and a second additional switch 630 of the additional switches 626, which is coupled between the second additional resistor and the node linking the first additional resistor 632 with the first additional switch 628. Due to this arrangement, depending upon whether none of the additional switches 626, or only the first additional switch 628, or both of the first and second additional switches 628, 630 are closed, none of the additional resistors 612, the first additional resistor 632, or both of the first and second additional resistors 632, 634 are coupled in parallel with the subcircuit 610 and the resistor 602.

The resistance of each of the additional resistors 612 can be an arbitrary number, and in some embodiments the resistances of these resistors can be of equal value or take on different values. However, in the present embodiment, the resistances of each of the resistors 612 are all equal (shown as R), and as a consequence the currents that flow through each of the resistors 612 when any of those resistors is coupled in parallel with the resistor 602 are identical (as dependent upon the voltage at the node 603) and can be viewed as corresponding to the currents $I_{LSB}$ driven by each of the current sources of FIG. 4. Also, given that in the present example embodiment each of the additional resistors 612 has a resistance R and each of the resistors 611 has a resistance 4 R, the current flowing through either of the additional resistors 612 when a corresponding one of the additional switches 626 is closed will be equal to the sum of the currents that will flow through the subcircuit 613, through all four of the resistors 611, if all four of those resistors are conductive due to all four of the switches 613 being closed.

More generally, it will be appreciated from a comparison of the DAC 600 of FIG. 6 and the DAC 400 of FIG. 4 that the combination of the first additional switch 628 and the first additional resistor 632 operates in the same or substantially the same manner as the combination of the first additional switch 428 and the first additional current source 432 of FIG. 4. Likewise, the combination of the second additional switch 630 and the second additional resistor 634 operates in the same or substantially the same manner as the combination of the second additional switch 430 and the second additional current source 434. Also, as with the embodiment of FIG. 4, FIG. 6 also shows dashed lines 636 (corresponding to the dashed lines 436 of FIG. 4), which indicate that, although only two each of the additional switches 626 and additional resistors 612 are shown, in other embodiments or implementations any arbitrary number of those switches and resistors can be present.

In addition to the above-discussed aspects, the DAC 600 additionally includes a further subcircuit 640 that is coupled in parallel with the second additional resistor 634, between the ground terminal 616 and a node 638 linking that one of the additional resistors with the second additional switch 630. In the present embodiment, the subcircuit 640 includes four switchable resistors 641 and four switches 643. As shown, each of the switches 641 is coupled between the ground terminal 616 and the node 638 by way of a respective one of the switches 643 (with the switch being connected between the node 638 and the respective resistor). The resistance of each of the switchable resistors 641 can be an arbitrary number, and in some embodiments the resistances of the different resistors can be of equal value or take on different values, although in the present embodiment the resistances are all equal (shown as 4 R). Control of the switching (closed/open) status of each of the switches 643 causes the respective switchable resistors 641 to be coupled to or decoupled from the node 638, such that the effective resistance provided by the subcircuit 640 can be varied.

Further in addition to the above aspects, FIG. 6 also shows control circuit components 648 of the DAC 600 that are employed to control operation of the DAC, and particularly are employed to control the opening and closing—including the timing of such opening and closing—of the switches 613, 626, and 643. More particularly as shown, the control circuit components 648 include first, second and third input ports 650, 652, and 654, respectively, at which are provided a clock signal 656, a zero-crossing signal 658, and a phase signal 660. The clock signal 656 can (but need not) include or correspond to any of the clock signals 308, 310, or 312 of FIG. 3. The zero-crossing signal 658 can (but need not) include or correspond to the input signal 306 of FIG. 3. The phase signal (or signals) 658 can be utilized to indicate the input phase of the input signal such as the input signal 306.

Additionally as shown, the control circuit components 648 includes a plurality of flip-flops (FFs) 662 that, in the present example, particularly include first, second, third, and fourth flip-flops 664, 666, 668, and 670, respectively. As indicated by additional ones of the dashed lines 636, the number of the flip-flops 662 that are present will correspond in part to the number of the additional switches 626 and, in the present example, will exceed the number of the additional switches 626 by two. As shown, the first input port 650 is tied to each of flip-flops 662. Further, the second input port 652 is coupled to the first flip-flip 664, which in turn is coupled by a first link 672 to the second flip-flip 666, which in turn is coupled by a second link 674 to the third flip-flop 668, which in turn is coupled by a third link 676 to the fourth flip-flop 670.

Additionally, the control circuit components 648 also include a first decoder 678 and a second decoder 680. As shown, the third input port 654 is coupled to each of the first and second decoders 678, 680. Further, the first link 672 also connects each of the first and second flip-flops 664 and 666 with the first decoder 678, and an additional link 682 couples the fourth flip-flop 670 with the second decoder 680. Further as illustrated by control lines 686, the first decoder 678 controls the open/closed status of each of switches 613 and, as illustrated by control lines 688, the second decoder 680 control the open/closed status of each of the switches 643. The second link 674 further couples the second and third flip-flops 666, 668 with the switch 628 such that the output of the second flip-flop 666 governs the open/closed status of that switch, and the third link 676 couples the third and fourth flip-flops 668, 670 with the switch 630 such that the output of the third flip-flop 668 governs the open/closed status of that switch.

Based upon a comparison of FIG. 3 and FIG. 6, it should be recognized that the circuit of FIG. 6 is capable of operating to generate an output signal $I_{out}$ that corresponds to any of the output signals 322, 332, and 342, and that this is achieved by appropriate actuation of the switches 613, 626, and 643 depending upon the phase of the clock signal 656. More particularly, based upon the phase of the clock signal 656, the first decoder 678 causes the switches 613 to be opened or closed in an appropriate manner so as to establish an additional current flow supplementing the baseline current passing through the resistor 602. Such actuation of the switches 613 results in a first step in the output signal $I_{out}$ that is consistent with having a virtual starting point that occurs at the time 320, regardless of the timing of the clock signal. Subsequently, the switches 626 in sequential order based upon their proximity to the node 603 (e.g., the first switch 628 followed by the second switch 630) are actuated so as to be closed, which further supplements the current flowing between the node 603 and the ground terminal 616, and consequently results in subsequent steps in the output signal $I_{out}$ that are respectively consistent with the subsequent steps 356, 366, and 376 of FIG. 3.

Further, as already discussed above in regard to FIGS. 3, 4, and 5, in at least some embodiments it will be desired that the output signal attain (or not surpass) a maximum value (or consistent end value) at a last step prior to returning to an initial value. The second decoder 680 governs actuation of the switches 643 of the further subcircuit 640 and allows for such desired behavior to be achieved. More particularly, based upon the actuation of the switches 643, an additional current flow occurs between the node 603 and the ground terminal 616 that results in a further increase in the output signal $I_{out}$. In the present example, the switches 643 are actuated so that the additional current flow between the node 603 and the ground terminal 616 via the further subcircuit 640 is equal to the difference between the increase in the output signal that occurs due to the flowing of current through either one of the resistors 626 and the increase in the output signal that occurs due to the flowing of current between the node 603 and the ground terminal 616 by way of the subcircuit 610.

To achieve such example operation, the further subcircuit 640 can be controlled to operate in a manner that is effectively the inverse of the operation of the subcircuit 610. For example, in the event that one of the four resistors 611 of the subcircuit 610 is controlled to be conductive (e.g., because one of the four switches 613 is closed), then in such case three out of the four resistors 641 of the further subcircuit 640 will ultimately, at the time of the final step, be caused to be conductive (e.g., because three of the four switches 643 are closed), and vice-versa. Notwithstanding this particular example embodiment, in other embodiments, the maximum value of the output $I_{out}$ can be any arbitrary number or value, and the numbers and resistance values of the switches and resistors that are present in either of the subcircuits 610 and 640 can be modified to achieve such maximum value. Further, the actuation of the switches in such subcircuits need not be inverted as described above in some other embodiments.

Turning to FIG. 7, the DAC 700 is an arrangement that is similar in many respects to the DAC 500 of FIG. 5. Among other things, the DAC 700 has a N-channel MOSFET 704 and an operational amplifier 706 that are (or can be) identical to the MOSFET 504 and operational amplifier 506. Similar to the embodiment of FIG. 5, the DAC 700 also includes an output resistor 708 with a resistance $R_{out}$, a base resistor 709, a plurality of additional resistors 712, a plurality of switches 714, and a current source 702, which respectively can be considered as corresponding to the output resistor 508, base resistor 509, plurality of additional resistors 512, plurality of switches 514, and current source 502, respectively. As shown, the base resistor 709 and the output resistor 708 are both coupled to a ground terminal 716. Further, the operational amplifier 706 includes a non-inverting terminal 718, an output terminal 720 and an inverting terminal 722, where the output terminal 720 is coupled to the gate of the MOSFET 704. Also, a node 703 links the source of the MOSFET 704 with each of the inverting terminal 722 and the output resistor 708, which is coupled between the node 703 and the ground terminal 716. A current $I_{out}$ flowing with respect to the drain of the MOSFET 704 constitutes the output current of the DAC 700 and can be considered the output signal of the DAC that corresponds for example to any of the output signals 322, 332, and 342 of FIG. 3.

As further shown, the base resistor 709 and each of the resistors of the plurality of additional resistors 712 are coupled in series with one another between the ground terminal 716 and the biasing current source 702. In contrast to the embodiment of FIG. 5, however, rather than employing the switchable resistor 510, the DAC 700 instead employs a subcircuit 710 between the base resistor 709 and the plurality of additional resistors 712. As shown, the subcircuit 710 particularly includes a plurality of resistors 711 and a plurality of switches 713. Each of the resistors 711 is coupled in parallel with a respective one of the switches 713, and the successive parallel combinations of the resistors and switches are coupled in series with one another between a first node 715 of the subcircuit 710 and a second node 717 of the subcircuit. The resistance of each of the resistors 711 can be an arbitrary number, and in some embodiments the resistances of the different resistors can be of equal value or take on different values, although in the present embodiment the resistances are all equal (shown as 0.25 R). Further as shown, the plurality of additional resistors 712 particularly includes two resistors, a first additional resistor 732 and a second additional resistor 734 (which in the present example are shown to have a resistance R). The base resistor 509 (also shown in this example to have a resistance 0.25 R) particularly is coupled between the first node 715 and the ground terminal 716, and the second node 717 is coupled to the first additional resistor 732 of the plurality of additional resistors 712. Additionally, the first additional resistor 732 is coupled between the second node 717 and the second additional resistor 734, which in turn is coupled between the first additional resistor 732 and the biasing current source 702.

Additionally, the switches 714 particularly include a first switch 724 and a plurality of additional switches 726 that in the present embodiment include first, second, third, and fourth additional switches 728, 729, 730, and 731, respectively. The first switch 724 links the first node 715 with the non-inverting terminal 718, the first additional switch 728 links the second node 717 with the non-inverting terminal 718, the second and third additional switches 729, 730 each link the non-inverting terminal 718 with a node coupling the first and second additional resistors 732, 734, and the fourth switch 731 links the non-inverting terminal with the node coupling the second additional resistor 734 with the biasing current source 702. The presence of dashed lines 736 between the first and second additional resistors 732, 734 is intended to signify that any arbitrary number n of the additional resistors 712 (and particularly any arbitrary number n>1) can be present depending upon the embodiment, and also to signify that correspondingly any arbitrary number n>2 (or alternatively n>1) of the additional switches 726 can be present depending upon the embodiment.

Further in addition to the above aspects, FIG. 7 also shows control circuit components 748 of the DAC 700 that are employed to control operation of the DAC, and particularly are employed to control the opening and closing, and the timing of such opening and closing, of the switches 724, 713, and 726. More particularly as shown, the control circuit components 748 include first, second and third input ports 750, 752, and 754, respectively, at which are provided a clock signal 756, a zero-crossing signal 758, and a phase signal 760. The clock signal 756 can (but need not) include or correspond to any of the clock signals 308, 310, or 312 of FIG. 3. The zero-crossing signal 758 can (but need not) include or correspond to the input signal 306 of FIG. 3. The phase signal (or signals) 760 can be utilized to indicate the input phase of the input signal such as the input signal 306.

Additionally as shown, the control circuit components 748 includes a plurality of flip-flops (FFs) 762 that, in the present example, particularly include first, second, third, fourth, fifth, and sixth flip-flops 764, 765, 766, 767, 768, and 769, respectively. As indicated by additional ones of the dashed lines 736, the number of the flip-flops 762 that are present will correspond in part to the number of the switches 714 and, in the present example, will exceed the number of the switches 714 by one. As shown, the first input port 750 is tied to each of flip-flops 762 such that the clock signal 756 is provided to each of the flip-flops. Further, the second input port 752 is coupled to the first flip-flop 764, which in turn is coupled by a first link 771 to the second flip-flop 765, which in turn is coupled by a second link 772 to the third flip-flop 766. The third flip-flop 766 in turn is coupled by a third link 773 to the fourth flip-flop 767, which in turn is coupled by a fourth link 774 to the fifth flip-flop 768, which in turn is coupled by a fifth link 775 to the sixth flip-flop 769.

Additionally, the control circuit components 748 also include a first decoder 770. As shown, the third input port 754 is coupled to the decoder 770 and, additionally, the first link 771 also links each of the first and second flip-flops 764 and 765 with the first decoder 770, such that the output signal of the first flip-flop 764 is provided to that decoder. Further as illustrated by control lines 780, the first decoder 770 controls the open/closed status of each of switches 713. Additionally, the second link 772 further couples the second and third flip-flops 765, 766 with the first switch 724 such that the output of the second flip-flop 765 governs the open/closed status of that switch, and the third link 773 couples the third and fourth flip-flops 766, 767 with the first additional switch 728 such that the output of the third flip-flop 766 governs the open/closed status of that switch. Also, the fourth link 774 couples the fourth and fifth flip-flops 767, 768 with each of the switches 729 and 730 such that the output of the fourth flip-flop 767 governs the open/closed status of those switches. Further, the fifth link 775 couples the fifth and sixth flip-flops 768, 769 with the switch 731 such that the output of the fifth flip-flop 768 governs the open/closed status of that switch. Also, an additional link 776 couples the sixth flip-flop 769 with the decoder 770 as well, such that operation of the decoder 770 also is based at least in part upon the output of that sixth flip-flop.

Based upon a comparison of FIG. 3 and FIG. 7, it should again be recognized that the circuit of FIG. 7 is capable of operating to generate an output signal $I_{out}$ that corresponds to any of the output signals 322, 332, and 342, and that this is achieved by appropriate actuation of the switches 713, 724, and 726 depending upon the phase of the clock signal 756. More particularly, based upon the phase of the clock signal 756, the decoder 770 causes the switches 713 to be opened or closed in an appropriate manner so as to increase or decrease the voltages experienced at the various nodes between subcircuit 710 and the current source 702. Such actuation of the switches 713—at a time when the DAC 700 also causes the first switch 724 to become opened instead of closed, further causes the first additional switch 728 to become closed instead of opened, and further causes each of the additional switches 729, 730, and 731 to remain opened—results in the application of a voltage to the non-inverting terminal 718 so as to produce a first step in the output signal $I_{out}$. The first step in the output signal $I_{out}$ that is produced by such operation particularly is consistent with having a virtual starting point that occurs at the time 320, regardless of the timing of the clock signal.

Additionally, to achieve subsequent steps in the output $I_{out}$ that are respectively consistent with the subsequent steps 356, 366, and 376 of FIG. 3, the control circuit components 748 of the DAC 700 cause further changes to the status of the switches 714. More particularly, to achieve the subsequent steps, the switch 728 is subsequently opened at the same time one or both of the switches 729 and 730 are closed, and then further the switches 729, 730 are again opened and the switch 731 is closed. It should additionally be appreciated that, although not illustrated in FIG. 7, the DAC 700 in alternate embodiments can be modified so that the output signal $I_{out}$ will attain (or not surpass) a maximum value (or consistent end value) at a last step prior to returning to an initial value. In view of the DAC 600 of FIG. 6, it will be appreciated that such alternate embodiments can be achieved, for example, by including an additional subcircuit with multiple resistors and switches (identical or substantially similar to the subcircuit 710) coupled between the current source 702 and the second (or final) additional resistor 734 of the additional resistors 726. Desired operation involving such an additional subcircuit can be achieved, for example, by appropriately controlling the actuation of the resistors and switches of the additional subcircuit by way of an additional decoder, so that the actuation of the additional subcircuit is substantially the inverse of the actuation of the subcircuit 710.

Notwithstanding the description provided above, the present disclosure is intended to encompass numerous other embodiments and variations of the embodiments described or shown herein. For example, although the control circuit components 648, 748 described in relation to FIGS. 6 and 7 entail discrete components such as decoders and flip-flops, in other embodiments one or more other types of components can be employed instead of or in addition to such discrete components including, for example, one or more microprocessors, microcomputers, programmable logic devices (PLDs), and/or other control components. In general, the term component as employed herein should be understood as encompassing one or more devices, components, or subcomponents.

Further for example, at least some embodiments encompassed herein relate to a system for providing an output signal based at least in part upon an input signal and a clock signal in a manner in which jitter is avoided or diminished notwithstanding one or more phase changes of the clock signal. The system includes an output signal generating component configured to perform a generating of the output signal, and a first component coupled at least indirectly to the output signal generating component, the first component having at least one first switch and a first variable characteristic. The system also includes a plurality of second components each having a respective additional switch and a respective fixed characteristic and coupled at least indirectly with the first component and the output signal generating component. In such embodiment, a switching status of the at least one first switch determines a first time at which the first variable characteristic begins to influence at least indirectly the generating of the output signal by the output signal generating component. Also, a first value of the first variable characteristic is set at least in part based upon the input signal and the clock signal so that, when the first variable characteristic influences at least indirectly the generating of the output signal by the output signal generating component, the output signal attains at the first time a first level that is at least indirectly dependent upon a phase of the clock signal relative to the input signal. Further, a respective additional switching status of each of the respective additional switches of each of the respective second components, respectively, determines a respective additional time at which the respective fixed characteristic of the respective second component begins to influence at least indirectly the generating of the output signal of the output signal generating component. Additionally, the additional switches are controlled so that the respective fixed characteristics of the respective second components successively influence at least indirectly the generating of the output signal by the output signal generating component at successive ones of the additional times, respectively, so that the output signal attains respective sequentially-larger levels at the respective additional times.

Also for example, at least some embodiments encompassed herein relate to a digital-to-analog converter (DAC) configured to provide an output signal based at least in part upon an input signal and a clock signal in a manner in which jitter is avoided or diminished notwithstanding one or more phase changes of the clock signal. The DAC includes a transistor device having first, second, and third terminals, the first terminal being an output terminal in relation to which is communicated the output signal. Additionally, the DAC also includes an operational amplifier having an inverting port, a non-inverting port, and an output port, where the output port is directly coupled to the second terminal of the transistor device, and either the inverting port or the non-inverting port is directly coupled to the third terminal. Further, the DAC also includes a first biasing component at least indirectly coupled to either the inverting port or the non-inverting port, and including any of a current source, a voltage source, or a resistor. Additionally, the DAC includes a first component having at least one first switch and a first variable characteristic coupled directly with a first one of the inverting and non-inverting ports, and a plurality of second components each having a respective additional switch and a respective fixed characteristic, where each of the second components is coupled directly with either the first component or a respective other one of the second components. In such embodiment, respective actuations of the at least one first switch and the additional switches occur at or substantially proximate to respective successive times at which respective level changes in the clock signal occur, respectively, such that the output signal takes on respective increased levels at or substantially proximate to the respective successive times. Further, the actuation of the at least one first switch is configured so that, or another action is taken in relation to the first component so that, a first value of the first variable characteristic is at least indirectly applied to or experienced by the first one of the inverting and non-inverting ports at or proximate to a first one of the successive times. Additionally, due to the first value of the first variable characteristic and each respective fixed characteristic, an effective slope associated with the output signal passes through a starting level at or substantially proximate to a zero-crossing time of the input signal.

Also for example, at least some embodiments encompassed herein relate to a method of providing an output signal based at least in part upon an input signal and a clock signal in a manner in which jitter is avoided or diminished notwithstanding one or more phase changes of the clock signal relative to the input signal. The method includes detecting both a first value of the input signal at a first time at which the clock signal experiences a first level change and also a second value of the input signal at a second time at which the clock signal experiences a second level change, the first time preceding a zero-crossing time of the input signal and the second time occurring after the zero-crossing time. The method also includes determining a first change value at least indirectly based upon the first and second values and based upon a standard step height value, and switching at least one switch so as to cause the output signal to change from a starting level to a first step level based at least in part upon the first change value at or substantially proximate to the second time. Additionally, the method further includes switching first and second additional switches respectively at or proximate to third and fourth times, respectively, at which the clock signal experiences third and fourth level changes, respectively, so as to cause the output signal to change from the first step level to a second step level and then to a third step level, respectively, at or proximate to the third and fourth times, respectively. Further, in such embodiment, the starting level, first step level, second step level, and third step level of the output signal are such that an effective slope associated with the output signal passes through the starting level at or substantially proximate to the zero-crossing time, whereby, notwithstanding the one or more phase changes in the clock signal, the output signal substantially or entirely retains a consistent phase relative to the input signal over a time period corresponding to a plurality of periods of the clock signal.

In view of the above discussion, it will be appreciated that embodiments of DACs and systems and methods employing such DACs such as those described above or otherwise encompassed herein can provide any of a variety of advantages. Among other things, at least some such circuits, systems and methods can allow for a new manner of slope generation that can substantially reduce or eliminate the jitter caused by quantization in the time domain. Such DACs or associated systems or methods allow for the use of a slow clock while maintaining a low jitter on the output signal. Additionally, at least some DACs and systems employing such DACs, such as speed sensor systems, encompassed herein, can be employed in a variety of applications including, for example, automotive applications. Indeed, DACs and systems employing such DACs, such as speed sensor systems, as encompassed herein, can be employed in a variety of products, including products having high-level or specific requirements relating to the jitter of an output signal.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A system for providing an output signal based at least in part upon an input signal and a clock signal in a manner in which jitter is avoided or diminished notwithstanding one or more phase changes of the clock signal, the system comprising:
   an output signal generating component configured to perform a generating of the output signal;
   a first component coupled at least indirectly to the output signal generating component, the first component having at least one first switch and a first variable characteristic;
   a plurality of second components each having a respective additional switch and a respective fixed characteristic and coupled at least indirectly with the first component and the output signal generating component;
   wherein a switching status of the at least one first switch determines a first time at which the first variable characteristic begins to influence at least indirectly the generating of the output signal by the output signal generating component,
   wherein a first value of the first variable characteristic is set at least in part based upon the input signal and the clock signal so that, when the first variable characteristic influences at least indirectly the generating of the output signal by the output signal generating component, the output signal attains at the first time a first level that is at least indirectly dependent upon a phase of the clock signal relative to the input signal,
   wherein a respective additional switching status of each of the respective additional switches of each of the respective second components, respectively, determines a respective additional time at which the respective fixed characteristic of the respective second component begins to influence at least indirectly the generating of the output signal of the output signal generating component, and
   wherein the additional switches are controlled so that the respective fixed characteristics of the respective second components successively influence at least indirectly the generating of the output signal by the output signal generating component at successive ones of the additional times, respectively, so that the output signal attains respective sequentially-larger levels at the respective additional times.

2. The system of claim 1, wherein the output signal generating component includes a transistor device, and wherein the first time and each additional time coincides with a respective level change of the clock signal.

3. The system of claim 2, wherein the transistor device includes a metal oxide semiconductor field effect transistor (MOSFET).

4. The system of claim 3, further comprising:
   an operational amplifier having an output terminal coupled to a gate of the MOSFET; and
   a biasing component coupled at least indirectly between a ground terminal and either an inverting or non-inverting terminal of the operational amplifier, the biasing component including one or more of a resistor, a current source, and a voltage source.

5. The system of claim 2, further comprising an operational amplifier, wherein the transistor device includes a first terminal and the operational amplifier includes a first port, and wherein the first terminal is directly coupled with the first port.

6. The system of claim 5, wherein the operational amplifier includes at least one second port, wherein the at least one second port is directly coupled with the first component and either directly coupled with, or indirectly coupled by way of the first component with, the plurality of second components.

7. The system of claim 1, wherein the first component includes either a first switchable current source or a first variable resistor that is connected in series with the at least one first switch.

8. The system of claim 7, wherein the first component includes the first switchable current source and the first value of the first variable characteristic is determined by a setting of the first switchable current source.

9. The system of claim 7, wherein the first component includes the first variable resistor and the first value of the first variable characteristic is determined by a resistance setting of the first variable resistor.

10. The system of claim 1, wherein the first component includes a plurality of resistors and the at least one first switch of the first component includes a plurality of first switches, wherein each of the resistors of the plurality of resistors is coupled either in series or in parallel with a respective one of the first switches of the plurality of first switches.

11. The system of claim 10, wherein the switching status of the at least one first switch includes a plurality of subsidiary switching statuses respectively associated with respective ones of the first switches, respectively, and wherein the first value of the first variable characteristic is determined by a setting of subsidiary switching statuses.

12. The system of claim 11, further comprising a control component that is coupled at least indirectly with the at least one first switch and determines the subsidiary switching statuses of the first switches.

13. The system of claim 12, wherein the control component includes a decoder or a microprocessor.

14. The system of claim 13, wherein the control component additionally includes one or more flip-flops that are coupled at least indirectly with the additional switches and that determine the additional switching statuses of the additional switches of the second components.

15. The system of claim 1, further comprising:
   a further component coupled at least indirectly to the output signal generating component, the first component having at least one second switch and a second variable characteristic,
   wherein a further switching status of the at least one second switch determines a further time at which the second variable characteristic begins to influence at least indirectly the generating of the output signal by the output signal generating component.

16. The system of claim 15, wherein the second variable characteristic is substantially an inverse of the first variable characteristic, wherein a switching status of the at least one first switch is determined by a first decoder of a control component of the system, and the further switching status of the at least one second switch is determined by a second decoder of the control component.

17. The system of claim 1, wherein the system operates as a speed sensing system and additionally includes one or more sensors that provide one or more sensor signals, and wherein the input signal is based at least indirectly upon the one or more sensor signals.

18. A digital-to-analog converter (DAC) configured to provide an output signal based at least in part upon an input signal and a clock signal in a manner in which jitter is avoided or diminished notwithstanding one or more phase changes of the clock signal, the DAC comprising:
- a transistor device having first, second, and third terminals, the first terminal being an output terminal in relation to which is communicated the output signal;
- an operational amplifier having an inverting port, a non-inverting port, and an output port, wherein the output port is directly coupled to the second terminal of the transistor device, and either the inverting port or the non-inverting port is directly coupled to the third terminal;
- a first biasing component at least indirectly coupled to either the inverting port or the non-inverting port, and including any of a current source, a voltage source, or a resistor;
- a first component having at least one first switch and a first variable characteristic coupled directly with a first one of the inverting and non-inverting ports;
- a plurality of second components each having a respective additional switch and a respective fixed characteristic, wherein each of the second components is coupled directly with either the first component or a respective other one of the second components,
- wherein respective actuations of the at least one first switch and the additional switches occur at or substantially proximate to respective successive times at which respective level changes in the clock signal occur, respectively, such that the output signal takes on respective increased levels at or substantially proximate to the respective successive times,
- wherein the actuation of the at least one first switch is configured so that, or another action is taken in relation to the first component so that, a first value of the first variable characteristic is at least indirectly applied to or experienced by the first one of the inverting and non-inverting ports at or proximate to a first one of the successive times, and
- wherein due to the first value of the first variable characteristic and each respective fixed characteristic, an effective slope associated with the output signal passes through a starting level at or substantially proximate to a zero-crossing time of the input signal.

19. The DAC of claim 18, further comprising at least one control component, and wherein the DAC either has a current configuration in which the first component is directly coupled with the inverting port or a voltage configuration in which the first component is directly coupled with the non-inverting port.

20. A method of providing an output signal based at least in part upon an input signal and a clock signal in a manner in which jitter is avoided or diminished notwithstanding one or more phase changes of the clock signal relative to the input signal, the method comprising:
- detecting both a first value of the input signal at a first time at which the clock signal experiences a first level change and also a second value of the input signal at a second time at which the clock signal experiences a second level change, the first time preceding a zero-crossing time of the input signal and the second time occurring after the zero-crossing time;
- determining a first change value at least indirectly based upon the first and second values and based upon a standard step height value;
- switching at least one switch so as to cause the output signal to change from a starting level to a first step level based at least in part upon the first change value at or substantially proximate to the second time;
- switching first and second additional switches respectively at or proximate to third and fourth times, respectively, at which the clock signal experiences third and fourth level changes, respectively, so as to cause the output signal to change from the first step level to a second step level and then to a third step level, respectively, at or proximate to the third and fourth times, respectively,
- wherein the starting level, first step level, second step level, and third step level of the output signal are such that an effective slope associated with the output signal passes through the starting level at or substantially proximate to the zero-crossing time,
- whereby, notwithstanding the one or more phase changes in the clock signal, the output signal substantially or entirely retains a consistent phase relative to the input signal over a time period corresponding to a plurality of periods of the clock signal.

* * * * *